(12) United States Patent
Toba et al.

(10) Patent No.: US 7,960,779 B2
(45) Date of Patent: Jun. 14, 2011

(54) NONVOLATILE SEMICONDUCTOR MEMORY AND MANUFACTURING METHOD THEREOF

(75) Inventors: Takayuki Toba, Yokohama (JP); Takayuki Okamura, Machida (JP); Moto Yabuki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 186 days.

(21) Appl. No.: 12/393,186

(22) Filed: Feb. 26, 2009

(65) Prior Publication Data

US 2009/0218607 A1 Sep. 3, 2009

(30) Foreign Application Priority Data

Feb. 28, 2008 (JP) ................................. 2008-048410

(51) Int. Cl.
| | |
|---|---|
| H01L 29/792 | (2006.01) |
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. . 257/324; 257/390; 257/411; 257/E29.165; 257/E29.309

(58) Field of Classification Search .................. 257/324, 257/390, 411, E29.165, E29.309
See application file for complete search history.

(56) References Cited

U.S. PATENT DOCUMENTS

| | | | | |
|---|---|---|---|---|
| 6,750,525 B2 | 6/2004 | Yim et al. | ...................... | 257/500 |
| 6,867,453 B2 * | 3/2005 | Shin et al. | ...................... | 257/314 |
| 6,946,349 B1 | 9/2005 | Lee et al. | ...................... | 438/275 |
| 7,227,786 B1 * | 6/2007 | Thomas | ................... | 365/185.28 |
| 7,341,914 B2 * | 3/2008 | Prinz et al. | ..................... | 438/260 |
| 7,547,942 B2 * | 6/2009 | Jeon et al. | ...................... | 257/324 |
| 7,547,943 B2 * | 6/2009 | Cho et al. | ...................... | 257/326 |
| 7,732,856 B2 * | 6/2010 | Sim et al. | ...................... | 257/324 |
| 2005/0128816 A1 * | 6/2005 | Lee et al. | ................. | 365/185.29 |
| 2005/0148138 A1 | 7/2005 | Noda et al. | ..................... | 438/216 |
| 2007/0045716 A1 * | 3/2007 | Chen et al. | ...................... | 257/324 |
| 2007/0063264 A1 * | 3/2007 | Huang et al. | .................. | 257/321 |

(Continued)

FOREIGN PATENT DOCUMENTS

JP 2002-100686 4/2002

(Continued)

OTHER PUBLICATIONS

U.S. Appl. No. 12/400,435, filed Mar. 9, 2009, Yaegashi.

(Continued)

*Primary Examiner* — Ida M Soward

(74) *Attorney, Agent, or Firm* — Oblon, Spivak, McClelland, Maier & Neustadt, L.L.P.

(57) ABSTRACT

A nonvolatile semiconductor memory of an aspect of the invention includes memory cells in the memory cell forming area, and select gate transistors in the select gate forming area. Each memory cell has two first diffusion layers formed in a semiconductor substrate, a first gate insulating film formed on the semiconductor substrate, a charge storage layer formed on the first gate insulating film, a first intermediate insulating film formed on the charge storage layer and a first gate electrode formed on the first intermediate insulating film. Each select gate transistor has two second diffusion layers formed in the semiconductor substrate, a second gate insulating film formed on the semiconductor substrate, a second intermediate insulating film formed in direct contact with the second gate insulating film and having the same structure as the first intermediate insulating film, and a second gate electrode formed on the second intermediate insulating film.

11 Claims, 11 Drawing Sheets

U.S. PATENT DOCUMENTS

2007/0284645 A1* 12/2007 Lee et al. .................. 257/314
2008/0175049 A1* 7/2008 Lin ......................... 365/185.05

FOREIGN PATENT DOCUMENTS

| JP | 2002-324860 | 11/2002 |
| JP | 2004-221589 | 8/2004 |
| JP | 2004-296683 | 10/2004 |
| JP | 2005-116551 | 4/2005 |
| JP | 2007-294935 | 11/2007 |

OTHER PUBLICATIONS

U.S. Appl. No. 12/407,131, filed Mar. 19, 2009, Sakuma.
Office Action mailed on Aug. 31, 2010, in Japanese Patent Application No. 2008-048410 (with English Translation).

* cited by examiner

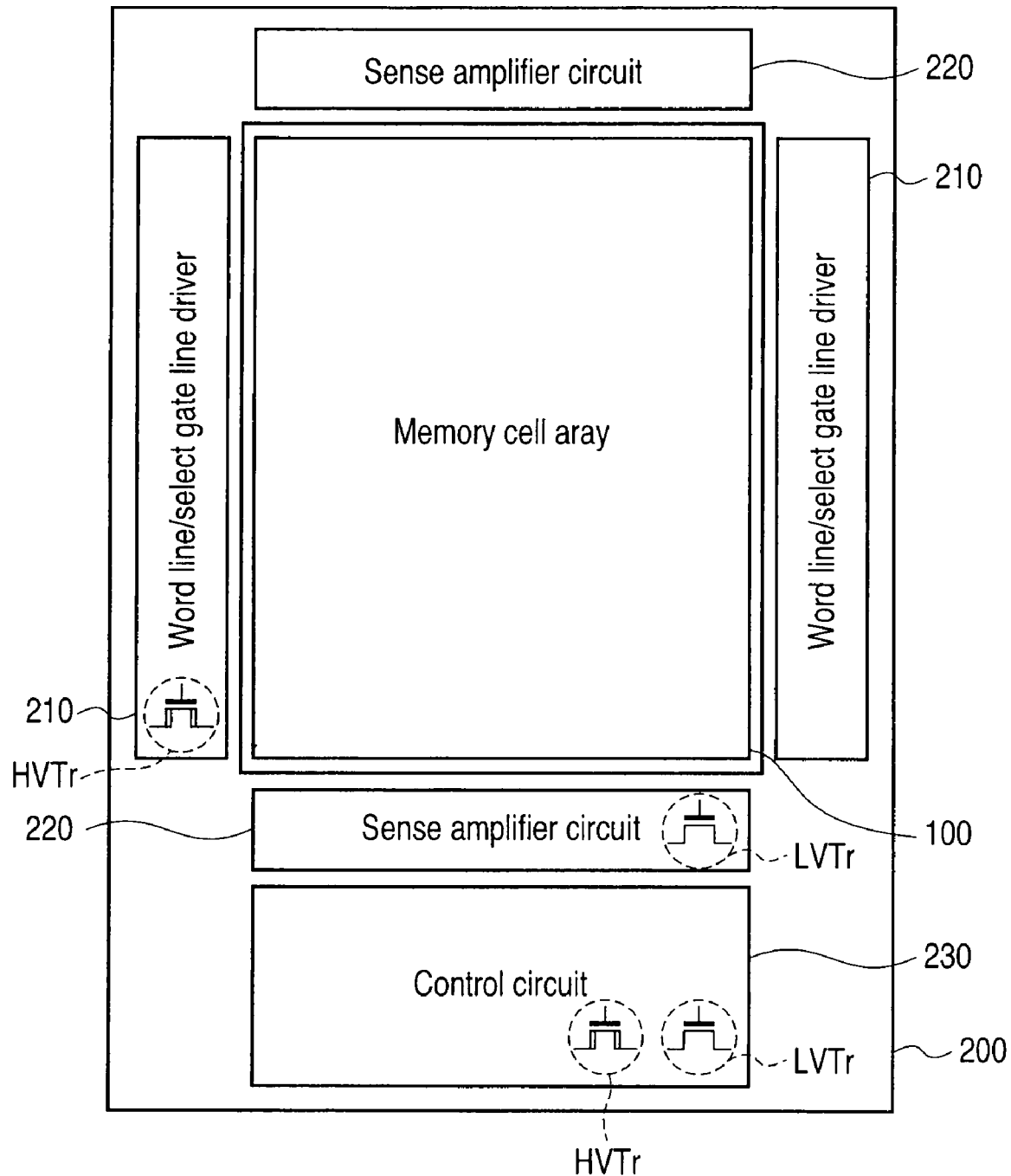
F I G. 1

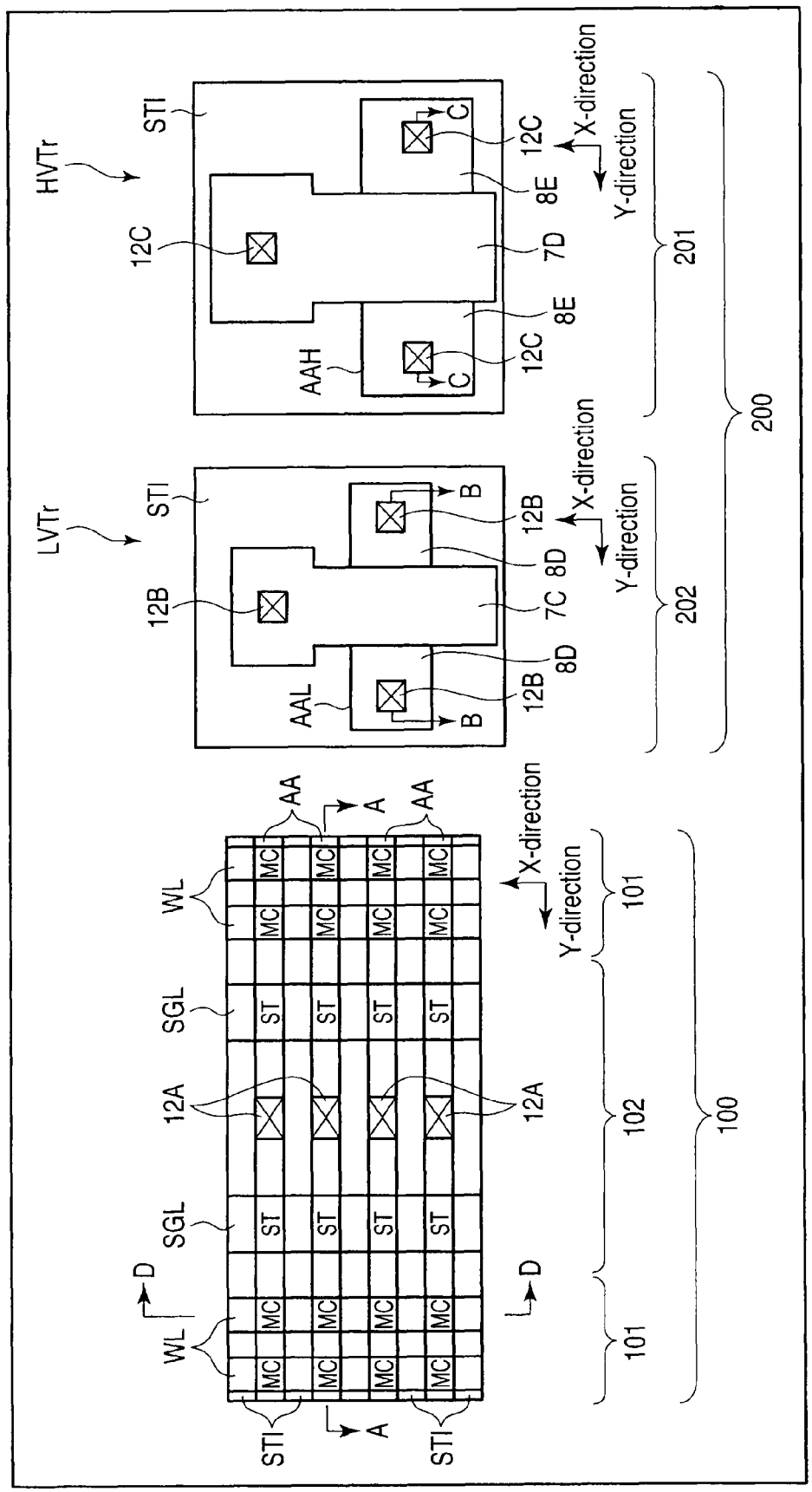
F I G. 3

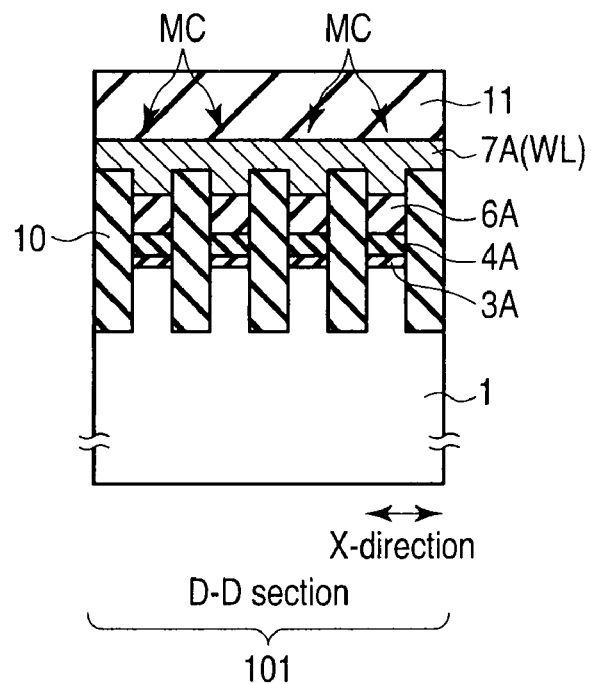
F I G. 5
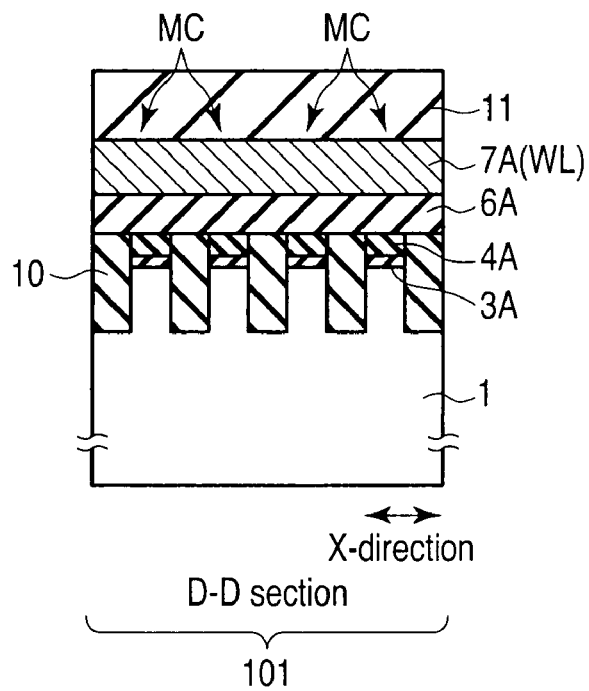
F I G. 6

NONVOLATILE SEMICONDUCTOR MEMORY AND MANUFACTURING METHOD THEREOF

CROSS-REFERENCE TO RELATED APPLICATIONS

This application is based upon and claims the benefit of priority from prior Japanese Patent Application No. 2008-048410, filed Feb. 28, 2008, the entire contents of which are incorporated herein by reference.

BACKGROUND OF THE INVENTION

1. Field of the Invention

This invention relates to a nonvolatile semiconductor memory and more particularly to a flash memory. Further, this invention relates to a manufacturing method of the nonvolatile semiconductor memory.

2. Description of the Related Art

Nonvolatile semiconductor memories, for example, flash memories are mounted as storage devices on various electronic devices.

The flash memory has a memory cell array area for data storage and a peripheral circuit area in which a control circuit for the memory cell array area is arranged as main construction areas. Further, memory cells and select gate transistors are arranged in the memory cell array area and peripheral transistors such as high-breakdown-voltage (high-voltage) metal-insulator-semiconductor (MIS) transistors and low-breakdown-voltage (low-voltage) MIS transistors are arranged in the peripheral circuit area.

Up to now, the memory cell having the structure in which a floating gate electrode is used as a charge storage layer is dominantly used. Recently, for example, memory cells with a metal-oxide-nitride-oxide-semiconductor (MONOS) structure using an insulating layer as a charge storage layer are positively developed in order to increase the storage capacity and attain miniaturization of memory cells caused by the increase in the storage capacity (for example, see Jpn. Pat. Appln. KOKAI Publication No. 2002-324860).

In a general flash memory manufacturing method, memory cells, select gate transistors and peripheral transistors are substantially simultaneously formed to reduce the number of manufacturing steps. If flash memories having MONOS memory cells are formed by use of the above manufacturing method, select gate transistors and peripheral transistors are formed with the gate structures having insulating layers that are the same as the charge storage layers on the gate insulating films thereof. With this structure, if voltage is applied to the gate electrode, charges are stored on the insulating layer (charge storage layer), the threshold voltages of the select gate transistors and peripheral transistors are varied and a problem occurs in the operations of the transistors and a circuit configured by the transistors.

Therefore, if memory cells and MIS transistors are formed by using different manufacturing steps in order to form the select gate transistors and peripheral transistors with the MIS structure having no charge storage layer, the number of manufacturing steps will be increased. Further, a new area must be provided near the boundary between the forming areas in order to securely attain a process margin of each forming area. In addition, since the memory cell has a charge storage layer and block insulating film and the select gate transistors and peripheral transistors have neither the charge storage layer nor the block insulating film, a difference in level occurs between the upper end of the gate electrode of the memory cell and the upper end of the gate electrode of the select gate transistor or peripheral transistor. Due to the difference in level, the degree of processing difficulty in the manufacturing process becomes extremely high.

BRIEF SUMMARY OF THE INVENTION

A nonvolatile semiconductor memory of an aspect of the present invention comprising a memory cell array area provided in a semiconductor substrate; a memory cell forming area and select gate forming area provided in the memory cell array area; a plurality of memory cells provided in the memory cell forming area; and a plurality of select gate transistors provided in the select gate forming area; each memory cell having two first diffusion layers provided in the semiconductor substrate in the memory cell forming area, a first gate insulating film provided on the surface of the semiconductor substrate between the first diffusion layers, a charge storage layer provided on the first gate insulating film, a first intermediate insulating film provided on the charge storage layer and acting as a block insulating film and a first gate electrode provided on the first intermediate insulating film; and each select gate transistor having two second diffusion layers provided in the semiconductor substrate in the select gate forming area, a second gate insulating film provided on the surface of the semiconductor substrate between the second diffusion layers, a second intermediate insulating film provided on and in direct contact with the second gate insulating film and having the same structure as the first intermediate insulating film, and a second gate electrode provided on the second intermediate insulating film.

A method of manufacturing a nonvolatile semiconductor memory of an aspect of the present invention comprising forming a first gate insulating film member in each of a memory cell forming area and select gate forming area provided in a memory cell array area of a semiconductor substrate; forming a charge storage layer member used as charge storage layers on the first gate insulating film member; removing part of the charge storage layer member that lies in the select gate forming area to expose the surface of the first gate insulating film member in the select gate forming area; removing part of the first gate insulating film member that lies in the select gate forming area and forming a second gate insulating film member on part of the semiconductor substrate that lies in the select gate forming area; forming an insulating member on part of the charge storage layer member that remains in the memory cell forming area and the second gate insulating film member in the select gate forming area; forming a gate electrode member on the insulating member; sequentially etching the gate electrode member, insulating member and charge storage layer member in the memory cell forming area and the gate electrode member and insulating member in the select gate forming area to form first laminated bodies each configured by a first gate electrode, a first intermediate insulating film used as a block insulating film of a memory cell and a charge storage layer in the memory cell forming area and form second laminated bodies each configured by a second gate electrode and a second intermediate insulating film with the same structure as the first intermediate insulating film in the select gate forming area; and respectively forming first and second diffusion layers in portions of the semiconductor substrate that lie in the memory cell forming area and select gate forming area with the first and second laminated bodies as a mask.

A method of manufacturing a nonvolatile semiconductor memory of an aspect of the present invention comprising simultaneously forming first and second gate insulating film members in a memory cell forming area and select gate forming area provided in a memory cell array area of a semiconductor substrate; forming a charge storage layer member used as charge storage layers on the first and second gate insulating film members; removing part of the charge storage layer member that lies in the select gate forming area to expose the surface of the second gate insulating film member in the select gate forming area; forming an insulating member on part of the charge storage layer member that remains in the memory cell forming area and the second gate insulating film member in the select gate forming area; forming a gate electrode member on the insulating member; sequentially etching the gate electrode member, insulating member and charge storage layer member in the memory cell forming area and the gate electrode member and insulating member in the select gate forming area to form first laminated bodies each configured by a first gate electrode, a first intermediate insulating film used as a block insulating film of a memory cell and a charge storage layer in the memory cell forming area and form second laminated bodies each configured by a second gate electrode and a second intermediate insulating film with the same structure as the first intermediate insulating film in the select gate forming area; and respectively forming first and second diffusion layers in portions of the semiconductor substrate that lie in the memory cell forming area and select gate forming area with the first and second laminated bodies as a mask.

BRIEF DESCRIPTION OF THE SEVERAL VIEWS OF THE DRAWING

FIG. 1 is a schematic view showing a whole configuration of a flash memory.

FIG. 3 is a plan view showing the structure of a flash memory according to an embodiment of this invention.

FIG. 5 is a cross-sectional view showing the structure of the flash memory according to the above embodiment of this invention.

FIG. 6 is a cross-sectional view showing the structure of the flash memory according to the above embodiment of this invention.

DETAILED DESCRIPTION OF THE INVENTION

Figure 2:
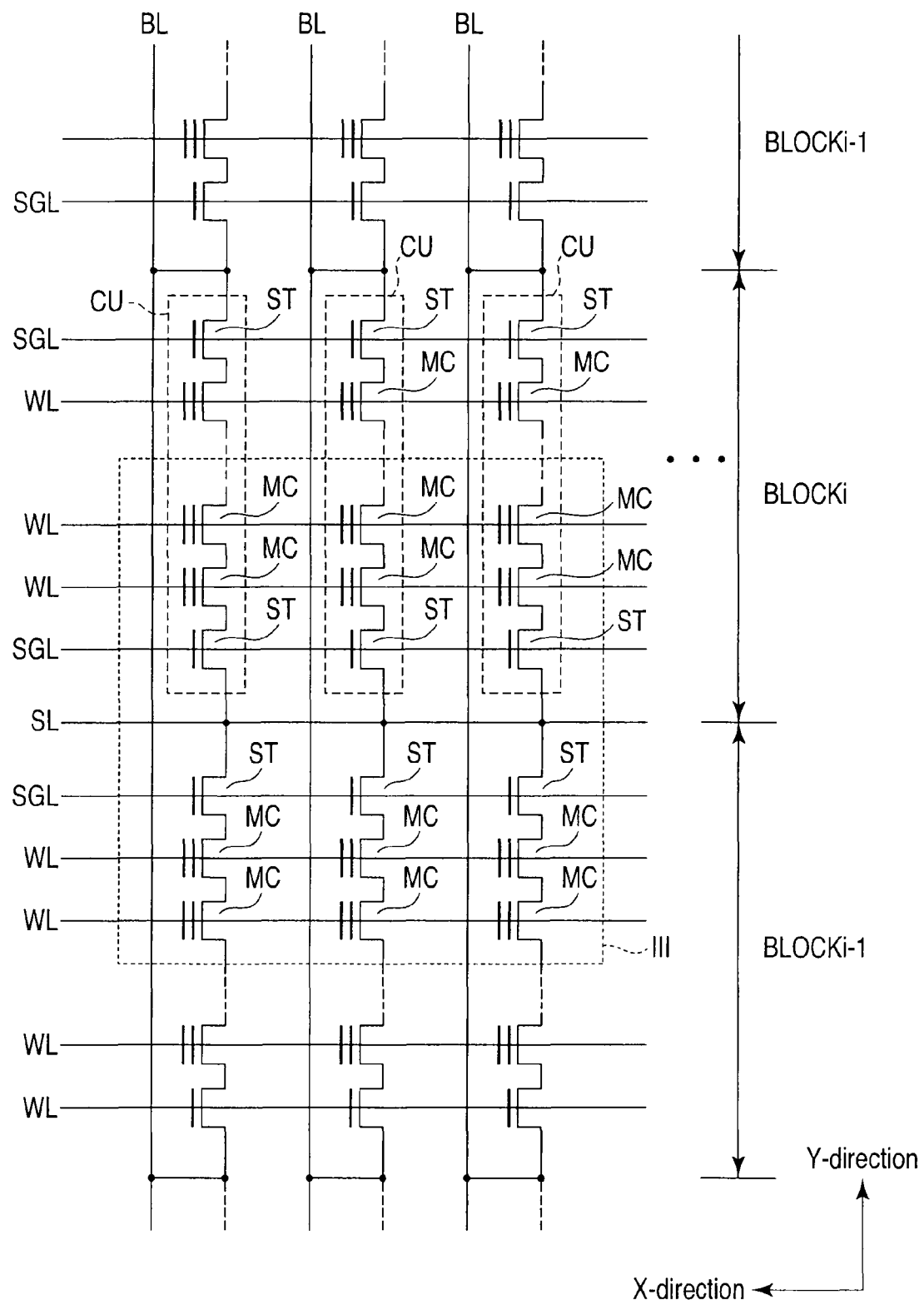
FIG. 2 is an equivalent circuit diagram of a memory cell array.

Now, some embodiments for embodying examples of the present invention are explained in detail with reference to the accompanying drawings.

1. Outline

A nonvolatile semiconductor memory according to one embodiment of this invention relates to a flash memory in which MONOS memory cells are used, for example.

In the flash memory according to this embodiment, the gate structure of a memory cell is a structure in which a charge storage layer, block insulating film and gate electrode are laminated on a gate insulating film (tunnel insulating film). Further, the gate structure of a select gate transistor is a structure in which an intermediate insulating film with the same structure as the block insulating film of the memory cell and a gate electrode are laminated on the gate insulating film. In the gate structure of the select gate transistor, the intermediate insulating film is sandwiched between the gate insulating film and the gate electrode and thus the intermediate insulating film is formed in direct contact with the gate insulating film.

Thus, since the select gate transistor in the present embodiment contains no charge storage layer, variation in the threshold voltage caused by injection of charges into the charge storage layer does not occur in the select gate transistor.

Therefore, according to the embodiment of this invention, the operation of the flash memory can be stabilized.

Further, in the gate structure of the select gate transistor, the intermediate insulating film is disposed between the gate insulating film and the gate electrode. Therefore, in laminated bodies respectively configuring the gates of the memory cell and select gate transistor, the difference in the structures of the laminated bodies lies in that the charge storage layer is formed or not and the difference in height of the laminated bodies configuring the respective gates becomes approximately equal to the film thickness of the charge storage layer. Thus, the difference in level occurring between the upper ends of the two laminated bodies can be alleviated and a lowering in the process margin caused by the difference in level can be suppressed.

Therefore, according to the embodiment of this invention, the degree of processing difficulty in the flash memory manufacturing process can be lowered.

Further, in the embodiment of this invention, a manufacturing method of the nonvolatile semiconductor memory (flash memory) with the above structure is also explained.

2. Embodiment

Next, one embodiment of this invention is explained with reference to FIGS. 1 to 10.

(1) Configuration of Flash Memory:

The configuration of the nonvolatile semiconductor memory according to one embodiment of this invention is explained with reference to FIGS. 1 and 2. In this embodiment, a flash memory is explained as one example of the nonvolatile semiconductor memory.

FIG. 1 is a schematic view showing the configuration of the flash memory. As shown in FIG. 1, the flash memory is mainly configured by a memory cell array area 100 and a peripheral circuit area 200 surrounding the memory cell array area and the areas are provided on the same chip (semiconductor substrate).

In the memory cell array area 100, a plurality of memory cells and a plurality of select gate transistors are provided.

FIG. 2 is an equivalent circuit diagram showing the internal configuration of the memory cell array area 100. In FIG. 2, a NAND equivalent circuit diagram is shown as an example.

As shown in FIG. 2, the memory cell array area 100 includes a plurality of blocks.

Each block $BLOCK_i$ is configured by a plurality of cell units CU arranged in an X-direction. Each cell unit CU includes a NAND string configured by a plurality of memory cells MC serially connected in a Y-direction and two select gate transistors ST respectively connected to one end and the other end of the NAND string in the Y-direction.

A plurality of bit lines BL are formed to extend in the Y-direction and each bit line BL is connected to the drains of the select gate transistors ST provided on the drain side of the NAND strings. For example, a plurality of source lines SL are formed to extend in the X direction and connected to the sources of the select gate transistors ST provided on the source side of the NAND strings. Cell units CU arranged in the Y-direction commonly use one bit line BL. Further, every two blocks BLOCK adjacent in the Y-direction commonly use one source line SL.

A plurality of word lines WL are formed to extend in the X-direction that intersects with the Y-direction. Each word line WL is commonly connected to a plurality of memory cells adjacent in the X-direction. A plurality of select gate lines SG L are formed to extend in the X-direction and each select gate line is commonly connected to a plurality of select gate transistors ST adjacent in the X-direction. In each block $BLOCK_i$, $BLOCK_{i-1}$, $BLOCK_{i+1}$, the plurality of word lines WL are sandwiched between the two select gate lines SL.

In the peripheral circuit area 200, word line/select gate line drivers 210, sense amplifier circuits 220 and a control circuit 230 are provided. The circuits 210, 220, 230 have a plurality of high-breakdown-voltage (high-voltage) MIS transistors and a plurality of low-breakdown-voltage (low-voltage) MIS transistors used as peripheral transistors as constituents thereof.

(2) Structure:

The structures of the memory cells and select gate transistors provided in the memory cell area 100 and the high-voltage/low-voltage MIS transistors provided in the peripheral circuit area 200 are explained with reference to FIGS. 3 to 6. In this embodiment, only a portion of the memory cell array area 100 that corresponds to an area III (an area surrounded by dotted lines) in FIG. 2 is shown and explained for clarifying the explanation. Further, in the peripheral circuit area 200, one of high-voltage MIS transistors HVTr and one of low-voltage MIS transistors LVTr are shown and explained.

Figure 4:
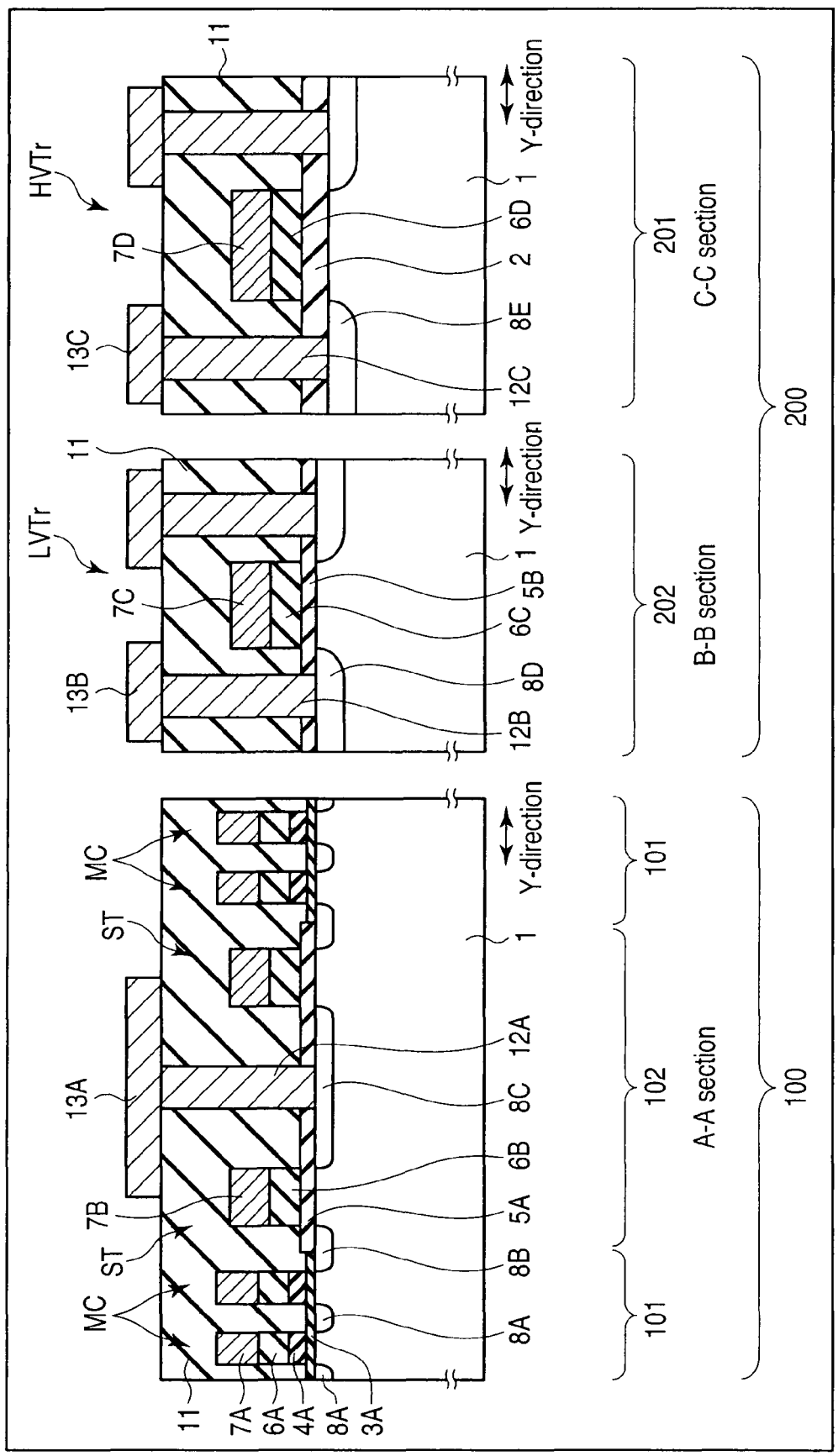
FIG. 4 is a cross-sectional view showing the structure of the flash memory according to the above embodiment of this invention.

FIG. 3 shows a plane structure of the memory cell array area 100 and peripheral circuit area 200. FIG. 4 shows the cross-sectional structures taken along the A-A line, B-B line and C-C line of FIG. 3. FIGS. 5 and 6 show examples of the cross-sectional structures of the memory cell array area 100 taken along the D-D line of FIG. 3.

As shown in FIG. 3, the surface region of the memory cell array area 100 is configured by a plurality of active regions AA and a plurality of element isolation regions STI. The active regions AA and element isolation regions STI are formed to extend in the Y-direction and each active region AA is sandwiched between two element isolation regions STI.

A plurality of word lines WL are formed to extend in the X-direction and intersect with the active regions AA. A plurality of memory cells MC are respectively arranged in intersecting portions between the word lines WL and the active regions AA. Like the word lines WL, the select gate lines SGL are formed to extend in the X-direction and the select gate transistors ST are respectively arranged in intersecting portions between the select gate lines SGL and the active regions AA. A contact 12A is provided in each active region AA between two select gate lines and is commonly used by the two select gate transistors ST.

Next, in the present embodiment, an area of the memory cell array area 100 in which memory cells are arranged is called a memory cell forming area 101 and an area thereof in which select gate transistors are arranged is called a select gate forming area 102.

The high-voltage MIS transistors HVTr and low-voltage MIS transistors LVTr are provided in the peripheral circuit area 200. In the following description in this embodiment, an area of the peripheral circuit area 200 in which high-voltage MIS transistors are arranged is called a high-voltage transistor forming area 201 and an area thereof in which low-voltage MIS transistors are arranged is called a low-voltage transistor forming area 202. The high-voltage and low-voltage transistor forming areas 201 and 202 are surrounded by element isolation regions and element regions AAL, AAH that are electrically isolated from each other are provided. Gate electrodes 7C, 7D of the MIS transistors LVTr, HVTr are formed in the X-direction to extend across the element regions AAL, AAH and lead out onto the element isolation regions STI. In portions in which the gate electrodes are lead out, contacts 12B, 12C are respectively formed on the gate electrodes 7C, 7D.

As shown in FIG. 4, the memory cells MC provided in the memory cell forming area 101 are memory cells of the MONOS structure. That is, the gate structure of each memory cell MC is configured by providing a charge storage layer 4A on a gate insulating film 3A on the surface of the semiconductor substrate 1 and disposing a block insulating film 6A between the charge storage layer 4A and a gate electrode 7A.

The memory cell MC has two diffusion layers 8A acting as source and drain regions. Every adjacent two of the memory cells MC in the Y-direction (channel length direction) commonly have the diffusion layer 8A and thus the memory cells MC are serially connected in the Y-direction.

For example, the gate insulating film (first gate insulating film) 3A of the memory cell MC is a silicon oxide film with a film thickness of approximately 4 nm and functions as a tunnel insulating film when charges are injected into the charge storage layer 4A. Further, the reliability of the gate insulating film can be enhanced and the write/erase characteristic can be enhanced by using an ONO film having the laminated structure of silicon oxide film/silicon nitride film/silicon oxide film as the gate insulating film 3A or using a film formed by disposing layers containing an injection assist level of germanium (Ge) or the like on both of the interfaces of the tunnel film as the gate insulating film 3A.

The charge storage layer 4A is a film containing a large number of charge trap levels and, for example, it is an insulating film such as a silicon nitride film. When the charge storage layer 4A is a silicon nitride film, the film thickness thereof is set to approximately 3 nm to 6 nm. For example, as shown in FIG. 5 or 6, the charge storage layers 4A are electrically isolated by element isolation insulating films 10 embedded in the element isolation regions STI in the X-direction (channel width direction). The cross-sectional structure of the charge storage layer 4A in the X-direction is not limited to the examples shown in FIGS. 5 and 6. For example, if the charge storage layer 4A is an insulating film, it is not necessary to isolate the memory cells MC adjacent in the X-direction and the structure in which the charge storage layers 4A are formed to extend in the X-direction on the active regions AA and element isolation regions STI may be provided.

The block insulating film (first intermediate insulating film) 6A prevents charges captured in the charge storage layer 4A from being discharged to the gate electrode 7A when voltage is applied to the gate electrode. As the block insulating film, a ferroelectric film is used and it is formed of one of $Al_2O_3$, $HfO_2$, $Ta_2O_5$, $La2O_3$, $LaLiO_3$, $ZrO_2$, $Y_2O_3$, $ZrSiO_4$, for example. The block insulating film 6A may be a composite film of ferroelectric films, a laminated film of a ferroelectric film and SiN film or a laminated film of a ferroelectric film and $SiO_2$ film. If the block insulating film 6A is an alumina film ($Al_2O_3$), the film thickness thereof is set to approximately 10 nm to 30 nm. The block insulating film 6A may be isolated for every memory cells MC adjacent in the X-direction by the element isolation films 10 as shown in FIG. 5 or may be formed to extend in the X-direction on the charge storage layers 4A and element isolation insulating films 10. In the following description, an example in which an alumina film is used as the block insulating film 6A is explained. However, this embodiment is not limited to this example.

The gate electrodes (first gate electrodes) 7A are formed to extend in the X-direction, each gate electrode is commonly used by the memory cells adjacent in the X-direction and functions as a word line WL. For example, the gate electrode 7A is formed of a metal material such as aluminum (Al) or copper (Cu), polysilicon or silicide. The gate electrode 7A may be a single-layered film of the above material or a laminated film formed by laminating films of different materials such as a so-called polycide film formed by laminating silicide on polysilicon, for example.

The select gate transistors ST provided in the select gate forming area 102 have the following structure. The gate structure of the select gate transistor ST is formed of a gate insulating film 5A on the surface of the semiconductor substrate 1, a gate electrode 7B and an intermediate insulating film 6B disposed between the gate insulating film 5A and the gate electrode 7B. Each select gate transistor ST uses diffusion layers 8B, 8C formed in the semiconductor substrate 1 as source and drain regions. The diffusion layer 8B is commonly used by the memory cell MC that lies adjacent thereto in the Y-direction and thus it is serially connected with the memory cells MC. The diffusion layer 8C is connected to an interconnection layer 13A via a contact 12A.

The film thickness of the gate insulating film 5A of the select gate transistor ST is set larger than the film thickness of the gate insulating film (tunnel insulating film) 3A of the memory cell and is set to approximately 7 nm, for example. The gate breakdown voltage of the select gate transistor ST can be attained by setting the film thickness of the gate insulating film 5A larger than the film thickness of the gate insulating film 3A. In order to attain high drain-source breakdown voltage, the gate length (channel length) of the select gate transistor ST is set larger than the gate length (channel length) of the memory cell MC.

The intermediate insulating film (second intermediate insulating film) 6B is formed on the gate insulating film 5A. Since the intermediate insulating film 6B is formed at the same time as formation of the block insulating film 6A of the memory cell MC, it has the same structure as that of the block insulating film 6A and is formed of an alumina film with a film thickness of approximately 10 nm to 30 nm.

The gate electrodes (second gate electrodes) 7B are formed to extend in the X-direction and each gate electrode is commonly used by the select gate transistors ST adjacent in the X-direction and functions as a select gate line SGL. Since the gate electrode 7B is formed at the same time as formation of the gate electrode 7A of the memory cell MC, it has the same structure as that of the gate electrode 7A.

The high-voltage MIS transistor HVTr provided in the high-voltage transistor forming area 201 has the following structure. The gate structure of the high-voltage MIS transistor HVTr is configured by a gate insulating film 2 in the surface of the semiconductor substrate 1, a gate electrode 7D and an intermediate insulating film 6D disposed between the gate insulating film 2 and the gate electrode 7D. Further, the high-voltage MIS transistor HVTr uses two diffusion layers 8E provided on the semiconductor substrate 1 as source and drain regions and each diffusion layer 8E is connected to an interconnection layer 13C via a contact 12C.

For example, the high-voltage MIS transistor HVTr functions to transfer high voltage such as write voltage. Therefore, the film thickness of the gate insulating film 2 is made further larger than the film thickness of the gate insulating film 5B of the select gate transistor ST and, as a result, the gate breakdown voltage of the high-voltage MIS transistor HVTr can be larger. For example, the film thickness of the gate insulating film 2 is set not smaller than approximately 30 nm and not larger than approximately 50 nm. The semiconductor substrate 1 in the high-voltage transistor forming area 201 is etched back. An upper surface of the semiconductor substrate 1 in the high-voltage transistor forming area 201 is lower than that of the low-voltage transistor forming area 202 so as to set the height (position) of the upper end of gate insulating film 2 of the high-voltage transistor equal to the height of the upper end of the gate insulating film 3A of the memory cell MC.

Also, in the high-voltage MIS transistor HVTr, like the select gate transistor ST, the structure in which the gate insulating film (third gate insulating film) 2 and intermediate insulating film (third intermediate insulating film) 6D are formed in direct contact with each other is made. The intermediate insulating film 6D is formed with the same structure as the block insulating film 6A of the memory cell MC and is formed of an alumina film, for example.

Further, since the gate electrode (third gate electrode) 7D is formed at the same time as formation of the gate electrode 7A of the memory cell MC, it has the same structure as the gate electrode 7A. The gate length of the high-voltage MIS transistor HVTr is set larger than the gate length of the select gate transistor ST or memory cell MC in order to attain the high drain-source breakdown voltage.

The low-voltage MIS transistor LVTr provided in the low-voltage transistor forming area 202 has substantially the same structure as the high-voltage MIS transistor HVTr. That is, the gate structure of the low-voltage MIS transistor LVTr is configured by a gate insulating film 5B on the surface of the semiconductor substrate 1, a gate electrode 7C and an intermediate insulating film 6C disposed between the gate insulating film 5B and the gate electrode 7C. Further, the low-voltage MIS transistor LVTr has two diffusion layers 8D functioning as source and drain regions in the semiconductor substrate 1 and each diffusion layer 8D is connected to an interconnection layer 13B via a contact 12B.

For example, the film thickness of the gate insulating film 5B of the low-voltage MIS transistor LVTr is set to approximately 6 nm to 9 nm. The intermediate insulating film 6C has the same structure as the block insulating film 6A of the memory cell MC and is formed of an alumina film, for example. Further, since the gate electrode 7C is formed at the same time as formation of the gate electrode 7A of the memory cell MC, it has the same structure as the gate electrode 7A.

For example, the low-voltage MIS transistors LVTr function as constituents of a sense amplifier and control circuit (logic gate). Like the select gate transistor ST or high-voltage MIS transistor HVTr, the gate length of the low-voltage MIS transistor LVTr is made larger than the gate length of the memory cell MC in order to attain the high drain-source breakdown voltage.

In the flash memory according to the embodiment of this invention, the select gate transistor ST provided in the memory cell array area 100 has a gate structure in which the intermediate insulating film 6B and gate insulating film 5A are formed in direct contact with each other.

That is, in this embodiment, the charge storage layer 4A and block insulating film 6A are disposed between the gate insulating film 3A and the gate electrode 7A in the memory cell MC. On the other hand, in the select gate transistor ST, the charge storage layer is not provided and only the intermediate insulating film 6B having the same structure as the block insulating film 6A is disposed between the gate insulating film 5A and the gate electrode 7B. Therefore, in the select gate transistor ST, no charge is injected into the charge storage layer if voltage is applied to the gate electrode 7B.

As a result, no variation in the threshold voltage caused by charge capturing in the charge storage layer occurs in the select gate transistor ST.

Figure 7:
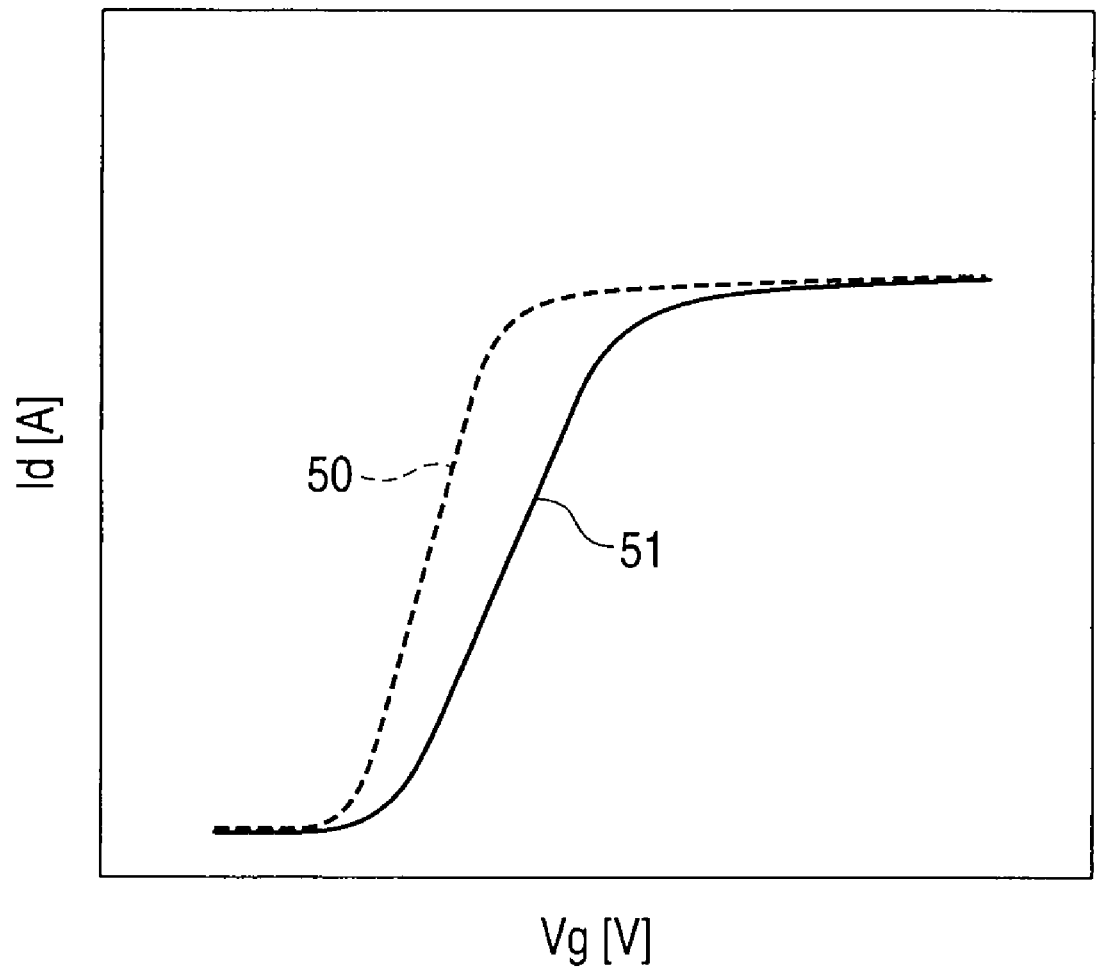
FIG. 7 is a diagram showing an operation characteristic of a MIS transistor according to an embodiment of this invention.

In the gate structure of the select gate transistor ST, the gate insulating film 5A and intermediate insulating film 6B provided between the gate electrode 7B and the surface of the semiconductor substrate 1 substantially function as the gate insulating film of the laminated structure. FIG. 7 shows a simulation result of an operation characteristic (Vg-Id characteristic) of the select gate transistor (MIS transistor) with the above gate structure. In FIG. 7, the abscissa (Vg [V]) indicates voltage on a linear scale and the ordinate (Id [A]) indicates a current on a log scale. In an example shown in FIG. 7, a characteristic curve 50 of a MIS transistor having a gate structure of gate insulating film/gate electrode and a characteristic curve 51 of a MIS transistor having a gate structure of gate insulating film/intermediate insulating film/gate electrode as in the present embodiment are shown. In this case, the film thickness of the intermediate insulating film (for example, alumina film) in the characteristic curve 51 is set to 20 nm, for example.

As indicated by the characteristic curve 51 in FIG. 7, the switching operation is performed substantially in the same manner as in the normal MIS transistor (characteristic curve 50) even if the intermediate insulating film is disposed between the gate insulating film and the gate electrode.

As described before, like the select gate transistor ST, the high-voltage/low-voltage MIS transistors HVTr, LVTr do not have the charge storage layer and have the gate structure in which the intermediate insulating films 6D, 6C having the same structure as the block insulating film 6A are formed in direct contact with the gate insulating films 2, 5B. Therefore, in the high-voltage/low-voltage MIS transistors HVTr, LVTr, the same effect as that obtained in the select gate transistor ST can be attained.

In order to attain the sufficient drive power and gate breakdown voltage of each transistor, the gate lengths of the select gate transistor ST and the high-voltage/low-voltage MIS transistors HVTr, LVTr are set larger than the gate length of the memory cell. The drain-source breakdown voltage (for example, punch-through resisting voltage) and gate breakdown voltage depend on the intensity of an electric field applied to the gate insulating film and the film thickness of the gate insulating film. Therefore, when the film thickness of the gate insulating film is small, the intensity of the electric field applied to the gate insulating film can be reduced by increasing the gate length thereof so as to attain sufficiently high drain-source breakdown voltage.

In this embodiment, the intermediate insulating film 6B is disposed between the gate insulating film 5A and the gate electrode 7B and, as a result, the intermediate insulating film 6B functions as part of the gate insulating film of the select gate transistor ST. Therefore, the substantial film thickness of the gate insulating film becomes larger and the sufficiently high gate breakdown voltage of the gate insulating film can be attained even if the gate length is small. Thus, the gate lengths of the transistors ST, HVTr, LVTr can be made small and, as a result, the sizes of the select gate forming area 102 and high-voltage/low-voltage transistor forming areas 201, 202 (peripheral circuit area 200) can be reduced. Therefore, the size of the memory cell forming area can be enlarged and this contributes to an increase in the storage capacity of the flash memory.

Further, in this embodiment, the intermediate insulating film 6B that is formed at the same time as formation of the block insulating film is disposed between the gate insulating film 5A and the gate electrode 7B in the select gate transistor ST. Therefore, the height (film thickness) of the laminated body configuring the gate of the memory cell MC is made larger by an amount corresponding to the film thickness of the charge storage layer 4A provided in the laminated body of the memory cell MC in comparison with the height (film thickness) of the laminated body configuring the gate of the select gate transistor. Since the film thickness of the charge storage layer 4A (for example, silicon nitride film) is set to approximately 5 nm, a difference in level occurring between the upper end of the laminated body (gate) of the memory cell MC and the upper end of the laminated body (gate) of the select gate transistor ST becomes approximately 5 nm.

If a step of removing the charge storage layer in the select gate forming area 102 is performed after a step of forming the block insulating film (intermediate insulating film), the block insulating film is removed together with the charge storage layer. In this case, the select gate transistor ST comes to have the structure in which the gate insulating film and gate electrode are formed in direct contact with each other and a difference in level occurring between the upper end of the gate (laminated body) of the memory cell MC and the upper end of the gate (laminated body) of the select gate transistor ST is set equal to the film thickness of the charge storage layer and block insulating film, for example, approximately 15 nm to 30 nm.

As in this embodiment, a difference in level occurring between the memory cell forming area 101 and the select gate forming area 102 can be made small by leaving behind the block insulating film (intermediate insulating film) on the gate of the select gate transistor ST. Therefore, the process margin caused by the difference in level can be improved in a lithography or etching process.

Further, in this embodiment, if a difference in level between the memory cell forming area 101 and the select gate forming area 102 becomes smaller, it is not necessary to perform the flattening process for eliminating the difference in level by a chemical mechanical polishing (CMP) method. Therefore, the number of manufacturing steps can be reduced. Further, in this embodiment, the difference in the structures of the laminated bodies used as the gates of the memory cell MC and select gate transistor ST is caused only by the presence or not of the charge storage layer with the small film thickness. Therefore, the gate processing of the memory cell MC and select gate transistor ST can be performed in one step. As a result, the gate processing can be easily performed in comparison with the laminated body having neither the charge storage layer nor the block insulating film.

Like the select gate transistor ST, in the high-voltage/low-voltage MIS transistors HVTr, LVTr, the intermediate insulating films 6D, 6C are provided in the laminated bodies configuring the gates. Therefore, in the high-voltage/low-voltage transistor forming areas 201, 202, the difference in level between the above area and the memory cell area 101 and the difference in the structures of the films formed become small. Thus, the number of manufacturing steps can be reduced and the degree of processing difficulty can be lowered.

As described above, according to the flash memory of the embodiment of this invention, the operation thereof can be stabilized.

Further, according to the flash memory of the embodiment of this invention, the degree of processing difficulty in the manufacturing process can be lowered.

(3) Manufacturing Method:

Next, a manufacturing method of a nonvolatile semiconductor memory (flash memory) according to the embodiment of this invention is explained with reference to FIGS. 4 to 10.

Figure 8:
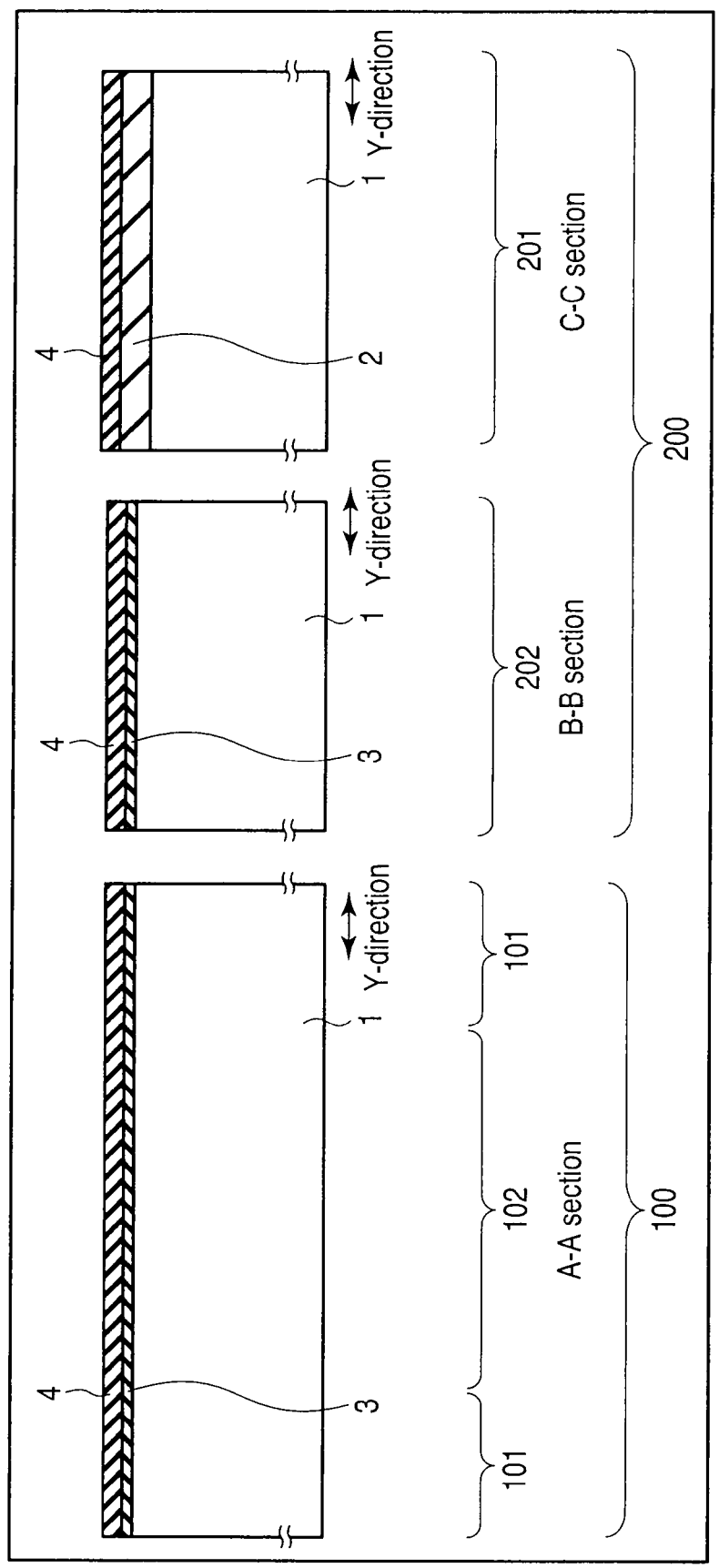
FIG. 8 is a cross-sectional view showing one step of a manufacturing process of a flash memory according to an embodiment of this invention.

As shown in FIG. 8, the semiconductor substrate 1 is etched in the high-voltage transistor forming area 201 by use of a reactive ion etching (RIE) method, for example. That is, the surface of the semiconductor substrate 1 in the high-voltage transistor forming area 201 is set lower than the surface of the semiconductor substrate 1 in the memory cell array area 100 and low-voltage transistor forming area 202.

Then, after a sacrifice oxide film (not shown) is formed on the surface of the semiconductor substrate 1, ion-implantation of different dose amounts, for example, is performed for the memory cell array area 100 and the high-voltage/low-voltage transistor forming areas 201, 202 of the peripheral circuit area to form well regions (not shown) with impurity concentrations corresponding to the respective element forming areas.

After the sacrifice oxide film is removed, the semiconductor substrate 1 is subjected to a thermal oxidation process, for example, to form an insulating film (for example, silicon oxide film) with a film thickness of approximately 30 nm to 50 nm on the surface of the semiconductor substrate 1. For example, the silicon oxide film is removed in the memory cell array area 100 and low-voltage transistor forming area 202 and is left behind only in the surface of the semiconductor substrate 1 in the high-voltage transistor forming area 201 by use of the photolithography technique and RIE method. The silicon oxide film 2 left behind in the high-voltage transistor forming area 201 is used as the gate insulating film of the high-voltage transistor. In this case, it is preferable to etched back the semiconductor substrate 1 in the high-voltage transistor forming area 201 so that the upper end of the oxide film 2 may be set nearly equal to the upper end of the surface of the semiconductor substrate 1 in the memory cell array area 100 in order to reduce the difference in level between the above regions.

For example, the surface of the semiconductor substrate 1 is subjected to a thermal oxidation process again and a silicon oxide film 3 is formed on the surfaces of the semiconductor substrate 1 in the memory cell array area 100 and low-voltage transistor forming areas 202. The silicon oxide film 3 is used as a tunnel insulating film of the memory cell and the film thickness thereof is set to approximately 3 nm to 5 nm.

Then, for example, an insulating member (that is hereinafter referred to as a charge storage layer member) 4 used as the charge storage layers of the memory cells is formed with the film thickness of approximately 4 nm to 6 nm on the silicon oxide films 2, 3 by a chemical vapor deposition (CVD) method. The charge storage layer member 4 is formed of a material containing a large number of charge capture levels, for example, it is formed of a silicon nitride film.

Figure 9:
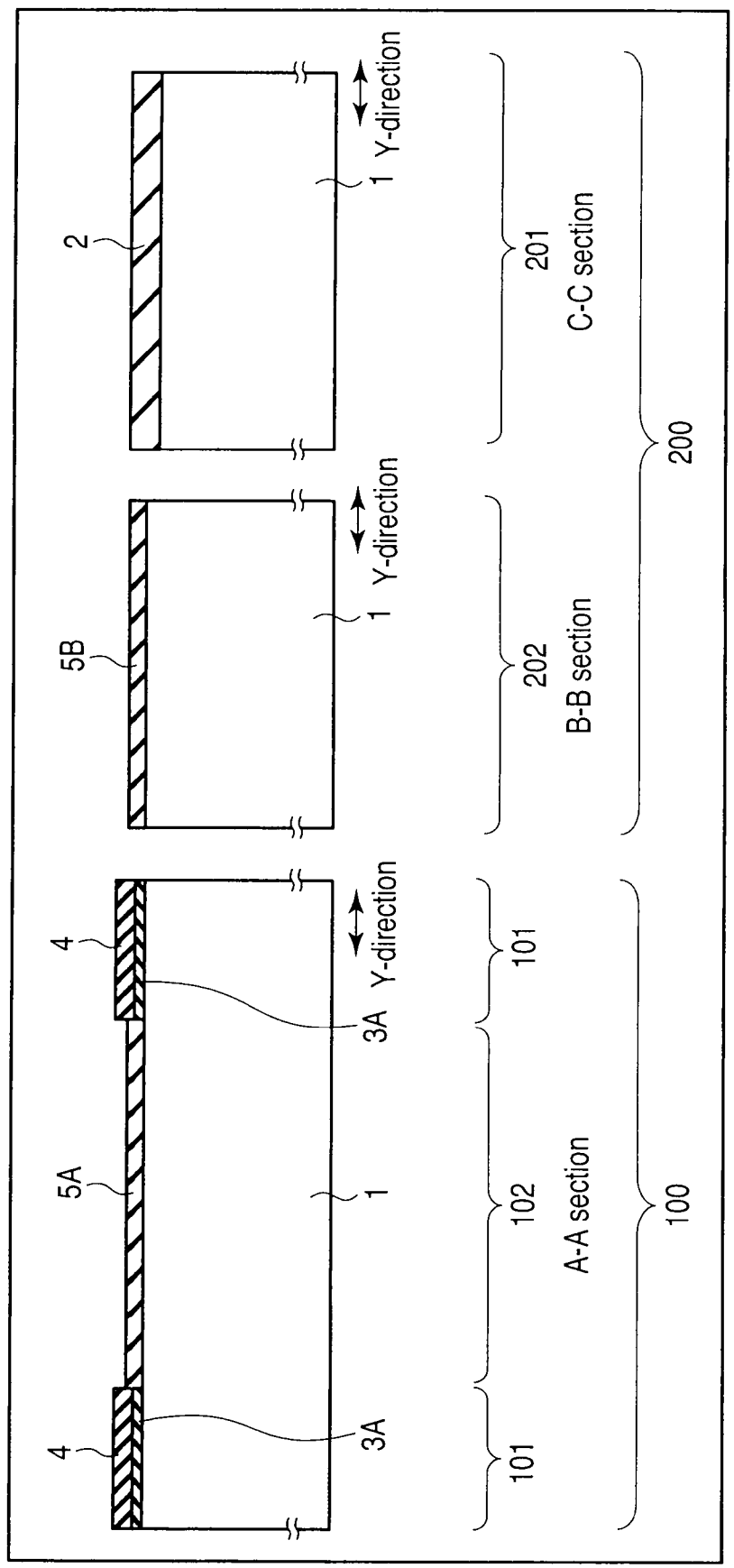
FIG. 9 is a cross-sectional view showing one step of the manufacturing process of the flash memory according to the above embodiment of this invention.

As shown in FIG. 9, the charge storage layer member 4 in the select gate forming area 102 of the memory cell array area 100 and in the high-voltage/low-voltage transistor forming areas 201, 202 is removed by use of a photolithography technique and RIE method, for example. In addition, for example, the silicon oxide film on the surface of the semiconductor substrate 1 in the select gate forming area 102 and low-voltage transistor forming areas 202 is also removed. Then, for example, new insulating films (for example, silicon oxide films) 5A, 5B are formed to a film thickness of approximately 6 nm on the surface of the semiconductor substrate 1 in the select gate forming area 102 and low-voltage transistor forming areas 202 by a thermal oxidation process. The silicon oxide films 5A, 5B are used as gate insulating films of the select gate transistors and low-voltage MIS transistors.

If the cross-sectional structure of the memory cell taken along the D-D line of FIG. 3 has the structure shown in FIG. 6, trenches are formed in the semiconductor substrate 1 by the photolithography technique and RIE method after formation of the charge storage layer member 4. Element isolation insulating films are filled into the trenches to form active regions and element isolation regions.

By this step, the structure is obtained in which the charge storage layer member 4 remains on the gate insulating films 3A of the memory cells in the memory cell forming area 101 and the charge storage layer member 4 is not present in the select gate forming area 102 to expose the surfaces of the silicon oxide films 5A used as the gate insulating films of the selection transistors. Also, the structure is obtained in which the charge storage layer member 4 is not present in the peripheral circuit area 200 to expose the surfaces of the silicon oxide films 2, 5B used as the gate insulating films of the high-voltage/low-voltage MIS transistors.

Figure 10:
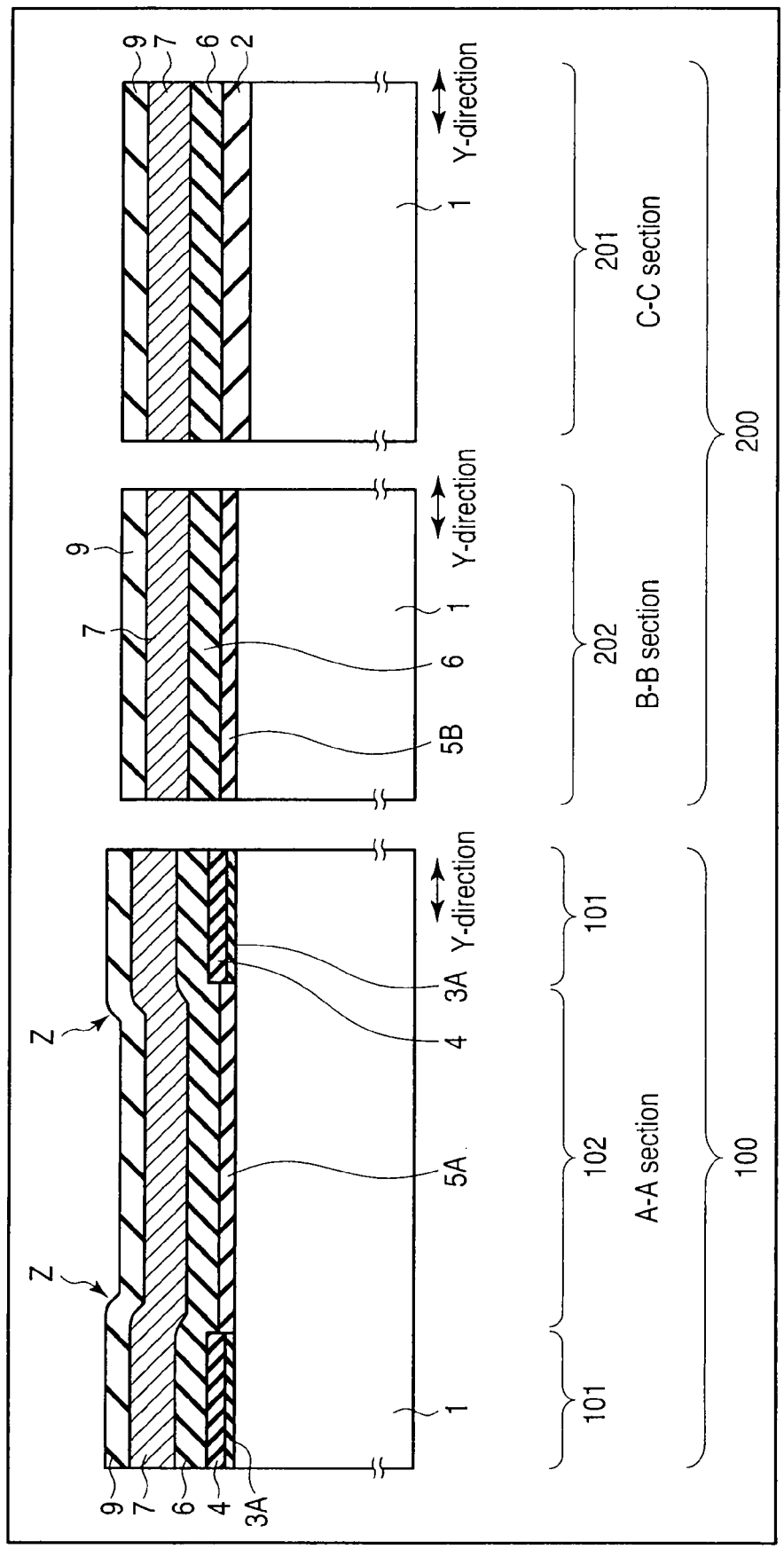
FIG. 10 is a cross-sectional view showing one step of the manufacturing process of the flash memory according to the above embodiment of this invention.

As shown in FIG. 10, an insulating member 6 used as the block insulating films of the memory cells is formed with a film thickness of approximately 10 nm to 30 nm on the charge storage layer member 4, insulating films 5A, 5B and the silicon oxide film 2 in the memory cell array area 100 and peripheral transistor area 200 by the CVD method, for example. The insulating member 6 is formed of alumina ($Al_2O_3$), for example. However, the insulating member 6 is not limited to this material and can be formed of another ferroelectric insulating material of, for example, hafnium oxide or an insulating film such as a silicon nitride film or silicon oxide film.

Further, a gate electrode member 7 is formed on the insulating film member 6 and a mask member 9 used as a mask at the gate formation time is formed on the gate electrode member 7. For example, as the gate electrode member 7, one of a polysilicon film, silicide film and a metal film of tungsten (W), aluminum (Al) or copper (Cu) is used. The structure may be a single-layered structure of the gate electrode member or a laminated structure such as a polycide structure obtained by laminating a polysilicon film and silicide film, for example.

If the gate electrodes of the memory cells and transistors are formed with the polycide structure, the gate electrodes are formed in the following steps. For example, a polysilicon film is formed on the insulating film 6 by, for example, the CVD method and a nickel (Ni) film is formed on the polysilicon layer by a sputtering method, for example. Then, the semiconductor substrate 1 is subjected to a heating process to react the upper portion of the polysilicon film with the Ni film to form silicide. Thus, a nickel silicide ($NiSi_2$) film is formed on the polysilicon film and a gate electrode member of the polycide structure is formed. If the gate electrode is formed with a single-layered structure of a silicide film or a so-called FUSI structure, the whole portion of the polysilicon film is silicified (modified into a silicide form) in the above silicide process. Further, if the gate electrode is formed with a single-layered structure of a polysilicon film or metal film, a gate electrode member 7 is formed on the insulating film 6 by the CVD method or sputtering method.

By the above process, the structure is obtained in which a charge storage layer member 4 used as the charge storage layers is disposed between the insulating films 3A used as the gate insulating films and the insulating film 6 used as the block insulating films in the memory cell forming area 101. On the other hand, the structure is obtained in which no charge storage layer member is present between the insulating films 2, 5A, 5B used as the gate insulating films and the insulating film 6 in the select gate forming area 102 and high-voltage/low-voltage transistor forming areas 201, 202 and the insulating films 5A, 5B, 2 are formed in direct contact with the insulating film 6.

In this case, a difference in level Z occurs between the memory cell forming area 101 and the select gate forming area 102. The difference in level Z is caused by the fact that the charge storage layer member 4 is not formed in the select gate forming area 102 and the upper end of films (that is called a laminated body) laminated in the area 102 is recessed towards the semiconductor substrate 1 side by an amount corresponding to the film thickness (for example, approximately 5 nm) of the charge storage layer member 4 with respect to the upper end of the laminated body in the memory cell forming area 101. Further, in the peripheral circuit area 200, the upper end of the laminated body in the area is recessed towards the semiconductor substrate 1 side by an amount almost equal to the film thickness of the charge storage layer member 4 with respect to the upper end of the laminated body in the memory cell forming area 101.

As shown in FIG. 4, the resultant semiconductor structure is subjected to patterning process by the photolithography technique so that the memory cells MC, select gate transistors ST and high-voltage/low-voltage MIS transistors HVTr, LVTr will have patterns of preset gate sizes. Based on the above patterns, the gate electrode member 7, insulating member 6 and charge storage layer member 4 are sequentially etched by the RIE method, for example. Thus, the laminated bodies used as the gates of the memory cells MC, select gate transistors ST and high-voltage/low-voltage MIS transistors HVTr, LVTr are formed.

Then, diffusion layers 8A, 8B, 8C, 8D, 8E used as source and drain regions are formed in the semiconductor substrate 1 in self-alignment with the laminated bodies with the laminated bodies used as a mask. As a result, the memory cells MC, select gate transistors ST and high-voltage/low-voltage MIS transistors HVTr, LVTr are formed in the memory cell array area 100 and peripheral circuit area 200.

An insulating layer 11 is formed to cover the gates of the memory cells MC, transistors ST, HVTr, LVTr by the CVD method, for example. Then, after the insulating layer 11 is subjected to the flattening process, contacts 12A, 12B, 12C are formed in the insulating layer 11 to be brought into direct contact with the diffusion layers 8C, 8D, 8E in the contact forming areas of the memory cell array area 100 and peripheral circuit area 200. Further, interconnection layers 13A, 13B, 13C are formed on the insulating layer 11 to be connected to the contacts 12A, 12B, 12C.

By the above manufacturing process, the flash memory according to the embodiment of this invention is completed.

In the manufacturing method of the embodiment of this invention, the charge storage layer member formed in the select gate forming area 102 in the memory cell array area 100 is removed. Then, an insulating member 6 used as block insulating films is formed in direct contact with the gate insulating films 5A in the area 102.

Therefore, the select gate transistor ST formed by the above manufacturing process does not have the charge storage layer in the gate thereof and the intermediate insulating film 6B formed at the same time as formation of the block insulating film 6A of the memory cell MC is formed in direct contact with the gate insulating film 5A. As a result, according to the manufacturing method of this embodiment, the select gate transistor in which variation in the threshold voltage caused by the presence of the charge storage layer will not occur can be provided.

In the conventional flash memory manufacturing method, in a case where not only the charge storage layer member 4 in the select gate forming area 102 but also the insulating member 6 used as the block insulating films is removed in order to suppress variation in the threshold voltage of the select gate transistor ST, the difference in level Z between the upper end of the memory cell forming area 101 and the upper end of the select gate forming area 102 shown in FIG. 9 becomes approximately equal to the film thickness of the charge storage layer member 4 and insulating member 6, for example, approximately 15 nm to 30 nm. In this case, a difference occurs in the resolution of lithography in the memory cell forming area 101 and the select gate forming area 102 due to the difference in level and the process margin is lowered.

On the other hand, in the flash memory manufacturing method according to the embodiment of this invention, since the insulating member 6 is left behind in the select gate forming area 102, the difference in level Z is set approximately equal to the film thickness (for example, 5 nm) of the charge storage layer member 4. Therefore, according to this embodiment, the difference in level Z can be made small and a lowering in the process margin can be suppressed.

When a CMP method for the flattening process is performed in order to eliminate the difference in level of approximately 15 nm to 30 nm, a step of forming a stopper film and sacrifice layer on a mask member 9 is additionally provided. Further, the stopper film and sacrifice film are left behind in a portion that is recessed due to the difference in level Z and a step of removing them is also required.

However, in the manufacturing method according to this embodiment, the difference in level Z is small, and therefore, the flattening process for eliminating the difference in level after formation of the gate electrode member 7 may not be necessarily performed. Therefore, the number of flash memory manufacturing steps can be reduced.

Further, in a case where the charge storage layer member 4 and insulating member 6 in the select gate forming area 102 are removed as in the conventional case, the structures of the laminated bodies used as the gates are different in the memory cell forming area 101 and the select gate forming area 102 in a gate forming step. Therefore, it becomes difficult to securely attain the common etching selective ratio for the two areas 101, 102 and it is difficult to simultaneously etch and form the gates of the memory cells and select gate transistors.

However, in the manufacturing method according to this embodiment, the difference between the structures of the memory cell forming area 101 and the select gate forming area 102 depends on the presence or not of the charge storage layer member 4 with the small film thickness, and therefore, the degree of gate processing difficulty can be lowered.

Like the case of the select gate forming area 102, in the high-voltage/low-voltage transistor forming areas 201, 202, the charge storage layer member is removed and the gate insulating films 2, 5A are formed in direct contact with the insulating member 6. Therefore, according to the manufacturing method of this embodiment, the same effect as that obtained for the select gate forming area 102 can be attained for the high-voltage/low-voltage transistor forming areas 201, 202.

As described above, according to the flash memory manufacturing method according to the embodiment of this invention, the flash memory whose operation is stabilized can be provided.

Further, according to the flash memory manufacturing method according to the embodiment of this invention, the degree of processing difficulty can be lowered.

(4) Modification:

Next, a modification of the structure of the flash memory and a modification of the flash memory manufacturing method are explained with reference to FIGS. 11 and 12.

Figure 11:
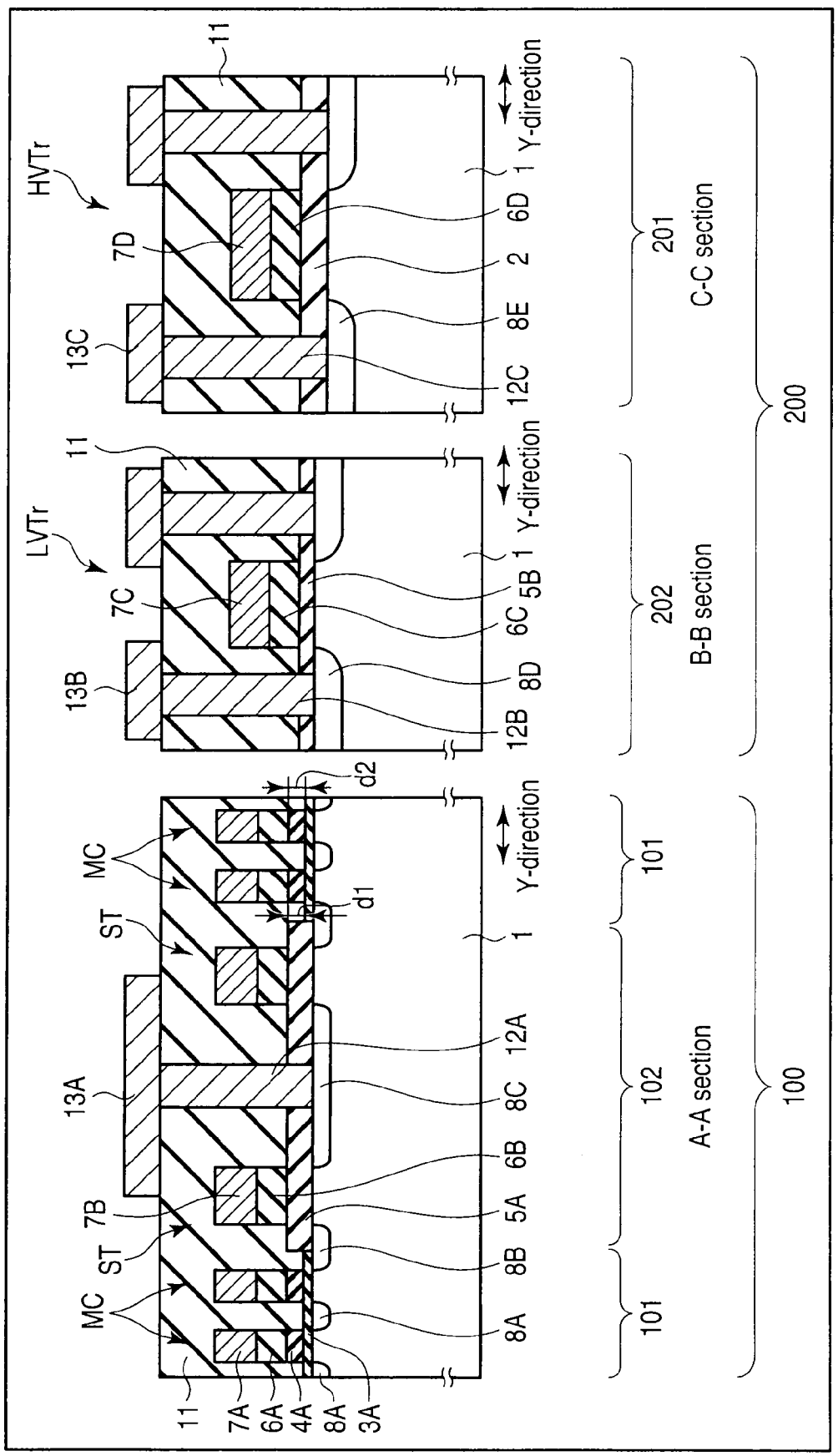
FIG. 11 is a cross-sectional view showing a modification of the flash memory according to the above embodiment of this invention.

(4-1) Modification 1:

FIG. 11 shows a modification of the flash memory according to the embodiment of this invention.

As shown in FIG. 11, the upper end of the gate electrode 7A of the memory cell MC is flush with the upper end of the gate electrode 7B of the select gate transistor ST. According to this structure, a difference in level between the upper end of the memory cell forming area 101 and the upper end of the select gate forming area 102 becomes substantially 0.

In the above structure, in a case where a difference in level between the surface of the gate insulating film 5A and the surface of the gate insulating film 3A is set to d1 and the film thickness of the charge storage layer 4A is set to d2, the films 3A, 4A, 5A may be formed to set the relation of d1=d2.

As a concrete example, in a case where the undersurface of the gate insulating film 3A is flush with the undersurface of the gate insulating film 5A, for example, the gate insulating film 3A, gate insulating film 5A and charge storage layer 4A are formed to respectively have film thicknesses of 4 nm, 8 nm and 4 nm. According to this example, d1=4 nm, d2=4 nm and the relation of d1=d2 is attained.

As a result, no difference in level occurs between the upper end of the memory cell forming area 101 and the upper end of the select gate forming area 102 and the stopper film and sacrifice oxide film are not left behind in a stepped portion.

(4-2) Modification 2:

A modification of the flash memory manufacturing method according to the embodiment of this invention is explained with reference to FIG. 12.

In the same step as that shown in FIG. 8, gate insulating films 2, 3 are formed in the respective forming areas 100, 201, 202 and a charge storage layer member 4 is formed on the gate insulating films 2, 3.

Figure 12:
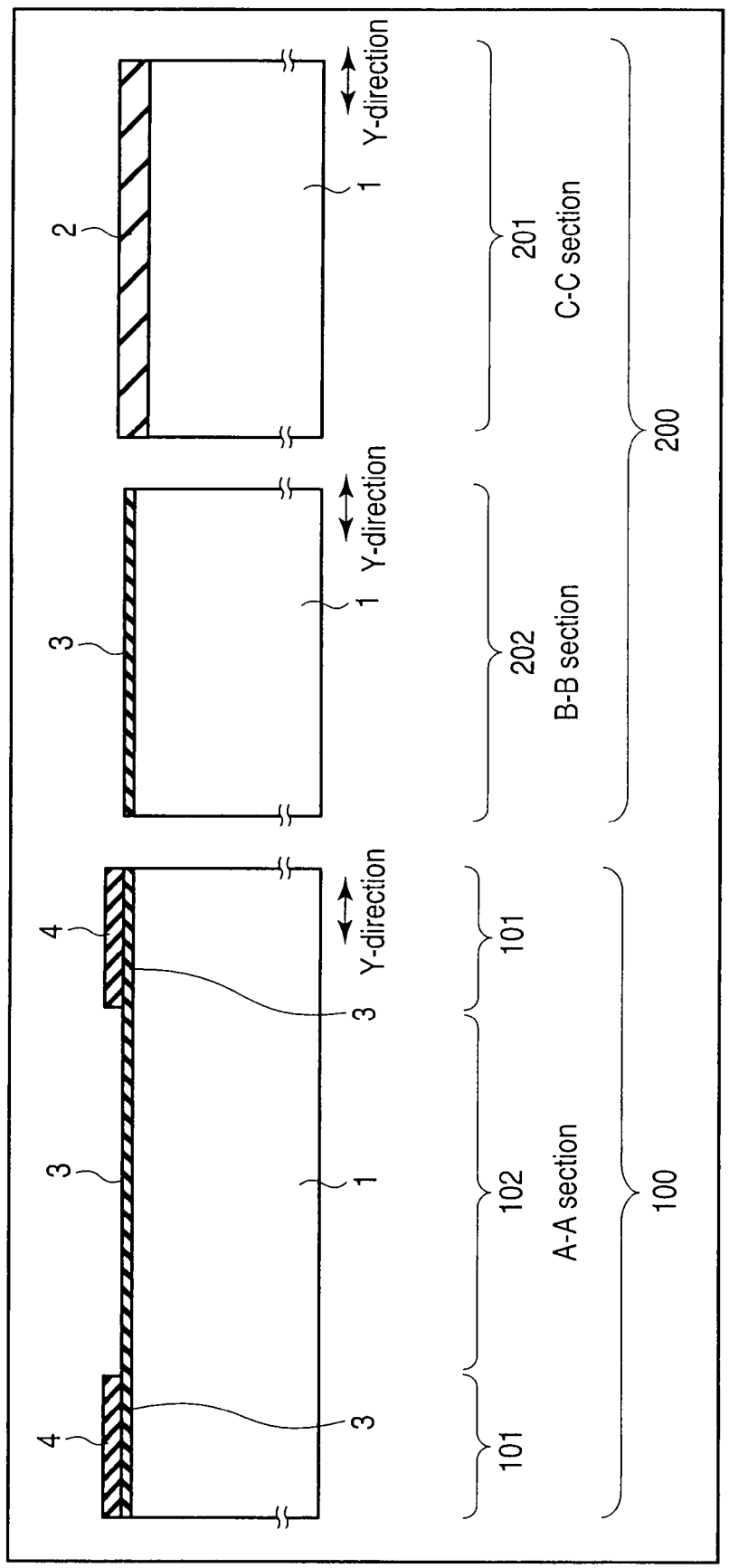
FIG. 12 is a cross-sectional view for illustrating a modification of the manufacturing process of the flash memory according to the above embodiment of this invention.

As shown in FIG. 12, the charge storage layer members 4 in the select gate forming area 102 and high-voltage/low-voltage transistor forming areas 201, 202 are removed by the photolithography technique and RIE method, for example.

By the above step, the charge storage layer member 4 remains on the gate insulating films 3 in the memory cell forming area 101, the charge storage layer member 4 is not present and the surface of the insulating film 3 is exposed in the select gate forming area 102. Likewise, in the peripheral circuit area 200, the charge storage layer member 4 is not present and the surfaces of the insulating films 2, 3 used as the gate insulating films of the high-voltage/low-voltage MIS transistors are exposed.

Then, in this modification, the insulating film 3 in the select gate forming area 102 is not removed and an insulating member 6 used as block insulating films is formed on the insulating film 3 by the same step as that shown in FIG. 10. Likewise, in the low-voltage transistor forming area 202, the insulating film 3 is not removed and an insulating member 6 is formed on the insulating film 3.

In the same step as that of FIG. 10, a gate electrode member 7 is formed on the insulating member 6 and memory cells MC, select gate transistors ST, low-voltage/high-voltage MIS transistors LVTr, HVTr are formed.

According to the flash memory manufacturing method shown in this modification, the insulating films 3 with the same structure (film thickness) as that of the gate insulating films (tunnel oxide films) of the memory cells MC are used as the gate insulating films of the select gate transistors ST and low-voltage MIS transistors LVTr. As described before, according to the embodiment of this invention, since the intermediate insulating films 6B, 6C with the same structure as that of the block insulating film are also substantially used as portions of the gate insulating films, no problem occurs in the functions of the select gate transistors ST and low-voltage MIS transistors LVTr even if the insulating film 3 is thin.

Therefore, according to the flash memory manufacturing method described in this modification, a step of removing the gate insulating films of the memory cells MC in the select gate forming area 102 and peripheral circuit area 202 and a step of forming new gate insulating films thereafter can be omitted.

(4-3) Modification 3:

Next, as the third modification 3, a flash memory manufacturing method in which the cross-sectional structure of the memory cell taken along the D-D line of FIG. 3 is the structure of FIG. 5 is explained. In this case, since the manufacturing process shown in this modification is substantially the same as the manufacturing process shown in FIGS. 8 and 9 described in the above embodiment except the processing step for the cross section taken along the D-D line, the explanation thereof is omitted.

In the memory cell array area 100 and peripheral transistor area 200, an insulating member 6 used as the block insulating films of the memory cells is formed with the film thickness of approximately 10 nm to 30 nm on the charge storage layers 4 and insulating films 5A, 5B by the CVD method, for example. The insulating member 6 is formed of alumina ($Al_2O_3$), for example. However, the insulating member is not limited to this material and may be formed of another ferroelectric insulating material of, for example, hafnium oxide or an insulating film such as a silicon nitride film or silicon oxide film.

After the insulating member 6 used as the block insulating film is formed, trenches are formed in the semiconductor substrate 1 by the photolithography technique and RIE method. Element isolation insulating films 10 are filled into the trenches to form active regions and element isolation regions. A gate electrode member 7 is formed on the insulating film 6 and element isolation insulating films 10.

By this step, the structure is obtained in which the charge storage layer member 4 used as the charge storage layers is disposed between the insulating film 3A used as the gate insulating films and the insulating film 6 used as the block insulating films in the memory cell forming area 101. On the other hand, the charge storage layer member is not present between the insulating films 2, 5A, 5B and the insulating film 6 in the select gate forming area 102 and high-voltage/low-voltage transistor forming areas 201, 202 and the insulating films 2, 5A, 5B are formed in direct contact with the insulating films 6. After this, in the same step as the manufacturing step shown in FIG. 4, the gate electrodes of the transistors and the diffusion layers used as source and drain regions are formed and a flash memory according to this modification is completed.

In the flash memory manufacturing method according to the modification 3 of the embodiment of this invention, the same effect as that obtained in the embodiment of this invention can be attained.

3. Others

According to the example of this invention, the operation of the nonvolatile semiconductor memory can be stabilized.

In the embodiment of this invention, the memory cell array area with the NAND circuit configuration is explained as an example, but is not limited to this example. The circuit configuration of the memory cell array area may be another circuit configuration such as a NOR or AND circuit configuration, for example.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
   a memory cell array area provided in a semiconductor substrate;
   a memory cell forming area and select gate forming area provided in the memory cell array area;
   a plurality of memory cells provided in the memory cell forming area; and
   a plurality of select gate transistors provided in the select gate forming area;
   wherein each memory cell has two first diffusion layers provided in the semiconductor substrate in the memory cell forming area, a first gate insulating film provided on a surface of the semiconductor substrate between the first diffusion layers, a charge storage layer provided on the first gate insulating film, a first intermediate insulating film provided on the charge storage layer and acting as a block insulating film and a first gate electrode provided on the first intermediate insulating film; and each select gate transistor has two second diffusion layers provided in the semiconductor substrate in the select gate forming area, a second gate insulating film provided on the surface of the semiconductor substrate between the second diffusion layers, a second intermediate insulating film provided on and in direct contact with the second gate insulating film and having the same structure as the first intermediate insulating film, and a second gate electrode provided on the second intermediate insulating film.

2. The nonvolatile semiconductor memory according to claim 1, wherein every adjacent two of the plurality of memory cells commonly have the first diffusion layer and the plurality of memory cells are serially connected, the second diffusion layer of one of the select gate transistors is connected to the first diffusion layer disposed at one end of the series-connected memory cells, and the second diffusion layer of a different one of the select gate transistors is connected to the second diffusion layer disposed at the other of the select gate transistors.

3. The nonvolatile semiconductor memory according to claim 2, wherein a difference in level occurs between an upper end of the first gate electrode of each of the plurality of series-connected memory cells and an upper end of the second gate electrode of the select gate transistor.

4. The nonvolatile semiconductor memory according to claim 1, further comprising a peripheral circuit area provided in the semiconductor substrate, and a plurality of peripheral transistors provided in the peripheral circuit area, each of the peripheral transistors having two third diffusion layers provided in the semiconductor substrate in the peripheral circuit area, a third gate insulating film provided on the surface of the semiconductor substrate between the third diffusion layers and having film thickness larger than that of the second gate insulating film, a third intermediate insulating film provided on and in direct contact with the third gate insulating film and having the same structure as that of the first intermediate insulating film, and a third gate electrode provided on the third intermediate insulating film.

5. The nonvolatile semiconductor memory according to claim 1, wherein the second gate insulating film has film thickness larger than that of the first gate insulating film.

6. The nonvolatile semiconductor memory according to claim 1, wherein the film thickness of the second gate insulating film is equal to a sum of the film thickness of the first gate insulating film and the film thickness of the charge storage layer.

7. The nonvolatile semiconductor memory according to claim 1, wherein the second gate insulating film has the same film thickness as that of the first gate insulating film.

8. The nonvolatile semiconductor memory according to claim 1, further comprising an element isolation insulating film formed in the semiconductor substrate to define the memory cell forming area, an upper end of the element isolation insulating film being set higher than an upper end of the charge storage layer.

9. The nonvolatile semiconductor memory according to claim 1, further comprising an element isolation insulating film formed in the semiconductor substrate and sandwiched between the two memory cell forming areas, an a height of upper end of the element isolation insulating film being same as a height of an upper end of the charge storage layer.

10. The nonvolatile semiconductor memory according to claim 4, wherein a height of an upper end of the third gate insulating film is same as a height of an upper end of the first gate insulating film.

11. The nonvolatile semiconductor memory according to claim 1, wherein the first intermediate insulating film is formed of a ferroelectric film.

* * * * *